(12) United States Patent
Park et al.

(10) Patent No.: US 9,252,212 B2
(45) Date of Patent: Feb. 2, 2016

(54) POWER SEMICONDUCTOR DEVICE

(71) Applicant: SAMSUNG ELECTRO-MECHANICS CO., LTD., Suwon-Si, Gyeonggi-Do (KR)

(72) Inventors: Jae Hoon Park, Suwon-Si (KR); Ji Hye Kim, Suwon-Si (KR); Kyu Hyun Mo, Suwon-Si (KR); Dong Soo Seo, Suwon-Si (KR); In Hyuk Song, Suwon-Si (KR)

(73) Assignee: SAMSUNG ELECTRO-MECHANICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/243,873

(22) Filed: Apr. 2, 2014

(65) Prior Publication Data

US 2015/0187868 A1 Jul. 2, 2015

(30) Foreign Application Priority Data

Jan. 2, 2014 (KR) .................. 10-2014-0000244

(51) Int. Cl.
*H01L 29/66* (2006.01)
*H01L 29/06* (2006.01)
*H01L 29/739* (2006.01)
*H01L 29/10* (2006.01)

(52) U.S. Cl.
CPC .......... *H01L 29/063* (2013.01); *H01L 29/1095* (2013.01); *H01L 29/7397* (2013.01)

(58) Field of Classification Search
CPC ............ H01L 2924/00; H01L 29/0634; H01L 2224/48247; H01L 29/7816; H01L 29/063; H01L 29/1095; H01L 29/402; H01L 29/7811; H01L 29/0619
See application file for complete search history.

(56) References Cited

U.S. PATENT DOCUMENTS

| | | |
|---|---|---|
| 2001/0028083 A1 | 10/2001 | Onishi et al. |
| 2003/0218188 A1 | 11/2003 | Jeon et al. |
| 2006/0124997 A1 | 6/2006 | Yamauchi et al. |
| 2013/0037851 A1 | 2/2013 | Gejo |
| 2013/0140582 A1 | 6/2013 | Kawakami et al. |

FOREIGN PATENT DOCUMENTS

| | | |
|---|---|---|
| JP | 2001-298190 A | 10/2001 |
| JP | 2013-38329 A | 2/2013 |
| KR | 10-0425435 B1 | 3/2004 |
| KR | 10-2005-0067227 A | 6/2005 |
| KR | 10-2006-0066655 A | 6/2006 |
| KR | 10-2013-0063002 A | 6/2013 |
| KR | 10-1339574 B1 | 12/2013 |
| WO | 2004/042825 A1 | 5/2004 |

OTHER PUBLICATIONS

Notice of Office Action Korean Patent Application No. 10-2014-0000244 dated Mar. 1, 2015 with full English translation.

*Primary Examiner* — Tony Tran
(74) *Attorney, Agent, or Firm* — McDermott Will & Emery LLP

(57) ABSTRACT

A power semiconductor device may include: an active region in which a current flows through a channel formed when the device being turned on; a termination region disposed around the active region; a first semiconductor region of a first conductive type disposed in the termination region in a direction from the active region to the termination region; and a second semiconductor region of a second conductive type disposed in the termination region in the direction from the active region to the termination region, the first semiconductor region and the second semiconductor region being disposed alternately.

11 Claims, 4 Drawing Sheets

POWER SEMICONDUCTOR DEVICE

CROSS-REFERENCE TO RELATED APPLICATION

This application claims the benefit of Korean Patent Application No. 10-2014-0000244 filed on Jan. 2, 2014, with the Korean Intellectual Property Office, the disclosure of which is incorporated herein by reference.

BACKGROUND

The present disclosure relates to a power semiconductor device.

An insulated gate bipolar transistor (IGBT) refers to a transistor having a bipolar structure as a result of manufacturing a gate using a metal oxide semiconductor (MOS) and forming a p-type collector layer on a rear surface of the transistor.

After a power metal oxide semiconductor field effect transistor (MOSFET) according to the related art was developed, the MOSFET has been used in fields requiring fast switching characteristics.

However, due to a structural limitation of the MOSFET, a bipolar transistor, a thyristor, gate turn-off thyristors (GTOs), and the like, have been used in fields requiring a high voltage.

Since the IGBT is characterized by low forward voltage loss and fast switching speed, it has been widely used for fields which are impossible to implement with the existing thyristor, bipolar transistor, metal oxide semiconductor field effect transistor (MOSFET), and the like.

Describing an operation principle of the IGBT, in the case in which an IGBT element is turned on, a higher voltage is applied to an anode thereof than to a cathode thereof, and in the case in which the voltage higher than a threshold voltage of the element is applied to a gate electrode, polarity of a surface of a p-type body region located at a lower end of the gate electrode is reversed to thereby form an n-type channel.

Electron current injected into a drift region through a channel induces an injection of a hole current from a high concentration p-type collector layer located at a lower portion of the IGBT element, similar to a base current of the bipolar transistor.

Due to a high concentration injection of the minority carriers, a conductivity modulation phenomenon occurs in which conductivity in the drift region is increased by tens to hundreds of times.

Unlike the MOSFET, since the IGBT has a highly reduced resistance component in the drift region due to conductivity modulation, it may be used at a very high voltage.

The current flowing into the cathode is divided into the electron current flowing through the channel and the hole current flowing through a junction between the p-type body and an n-type drift region.

Unlike the MOSFET, since the IGBT has a p-n-p structure between the anode and the cathode due to the structure of a substrate, it does not have a diode embedded therein, such that it needs a separate diode connected thereto in anti-parallel.

The above-mentioned IGBT has main characteristics such as maintenance of blocking voltage, a decrease in conduction loss, and an increase in switching speed.

Particularly, in order to maintain the blocking voltage, a termination region is formed around an active region in which a current flows at the time of operation of the IGBT.

Since an entire size of the power semiconductor device is limited, the active region of the power semiconductor device is decreased in the case in which the termination region is increased in the power semiconductor device, such that performance of the device may be decreased.

Thus, a method capable of decreasing the size of the termination region while sufficiently maintaining the blocking voltage of the power semiconductor device has been demanded.

SUMMARY

An exemplary embodiment in the present disclosure may provide a power semiconductor device having an improved blocking voltage and a smaller termination region.

According to an exemplary embodiment in the present disclosure, a power semiconductor device may include: an active region in which a current flows through a channel formed when the device being turned on; a termination region disposed around the active region; a first semiconductor region of a first conductive type disposed in the termination region in a direction from the active region to the termination region; and a second semiconductor region of a second conductive type disposed in the termination region in the direction from the active region to the termination region, the first semiconductor region and the second semiconductor region being disposed alternately.

A product of an impurity concentration of the first semiconductor region and a width of the first semiconductor region may be equal to a product of an impurity concentration of the second semiconductor region and a width of the second semiconductor region.

An impurity concentration of the first semiconductor region and an impurity concentration of the second semiconductor region may gradually become lower as the first semiconductor region and the second semiconductor region become farther from the active region.

A thickness of the first semiconductor region and a thickness of the second semiconductor region may gradually become thinner as the first semiconductor region and the second semiconductor region become farther from the active region.

A depletion region may be expanded at a boundary between the first semiconductor region and the second semiconductor region in a blocking mode according to a voltage.

The power semiconductor device may further include an intermediate region formed between the active region and the termination region and serving to expand an electric field of the active region to the termination region.

The power semiconductor device may further include a deep body region of a second conductive type formed on the intermediate region.

The first semiconductor region and the second semiconductor region may have the impurity concentration lower than that of the deep body region.

According to an exemplary embodiment in the present disclosure, a power semiconductor device may include: an active region in which a current flows through a channel formed when the device being turned on; a termination region formed around the active region; and a resurf region disposed in the termination region in a direction from the active region to the termination region.

The resurf region may be formed by alternating a first semiconductor region of a first conductive type and a second semiconductor region of a second conductive type.

A product of an impurity concentration of the first semiconductor region and a width of the first semiconductor region may be equal to a product of an impurity concentration of the second semiconductor region and a width of the second semiconductor region.

An impurity concentration of the resurf region may gradually become lower as the resurf region becomes farther from the active region.

A thickness of the resurf region may gradually become gradually thinner as the resurf region becomes farther from the active region.

The power semiconductor device may further include an intermediate region formed between the active region and the termination region and serving to expand an electric field of the active region to the termination region.

The power semiconductor device may further include a deep body region of a second conductive type formed on the intermediate region.

The resurf region may have the impurity concentration lower than that of the deep body region.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
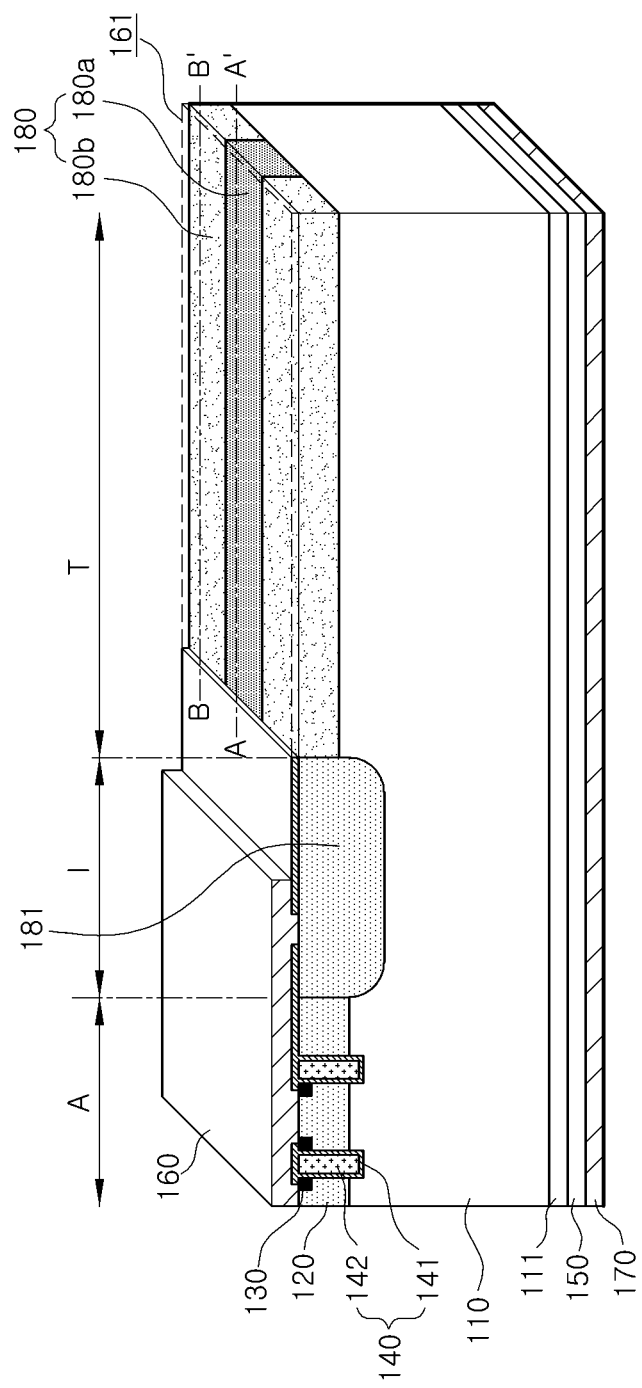
FIG. 1 schematically illustrates a perspective view of a power semiconductor device according to an exemplary embodiment of the present disclosure.

Exemplary embodiments of the present disclosure will now be described in detail with reference to the accompanying drawings.

The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

A power switch may be implemented by any one of a power MOSFET, an IGBT, several types of thyristors, and those similar to the above-mentioned devices. Most new technologies disclosed herein will be described based on the IGBT. However, several exemplary embodiments of the present disclosure disclosed herein are not limited to the IGBT, and, for example, may overall be applied to different forms of power switch technologies including the power MOSFET and several kinds of thyristors. Further, several exemplary embodiments of the present disclosure are illustrated as those including specific p-type and n-type regions. However, several exemplary embodiments of the present disclosure may also be equally applied to elements having opposite conductive types of several regions disclosed herein.

In addition, the n-type or the p-type used herein may refer to a first conductive type or a second conductive type. Meanwhile, the first conductive type and the second conductive type refer to conductive types different from each other.

In addition, "positive (+)" generally refers to a high concentration doped state and "negative (−)" refers to a low concentration doped state.

Hereinafter, for clarity of explanation, the first conductive type is represented by the n-type and the second conductive type is represented by the p-type, but they are not limited thereto.

In the drawings, an x direction refers to a width direction, a y direction refers to a length direction, and a z direction refers to a depth direction.

Figure 2:
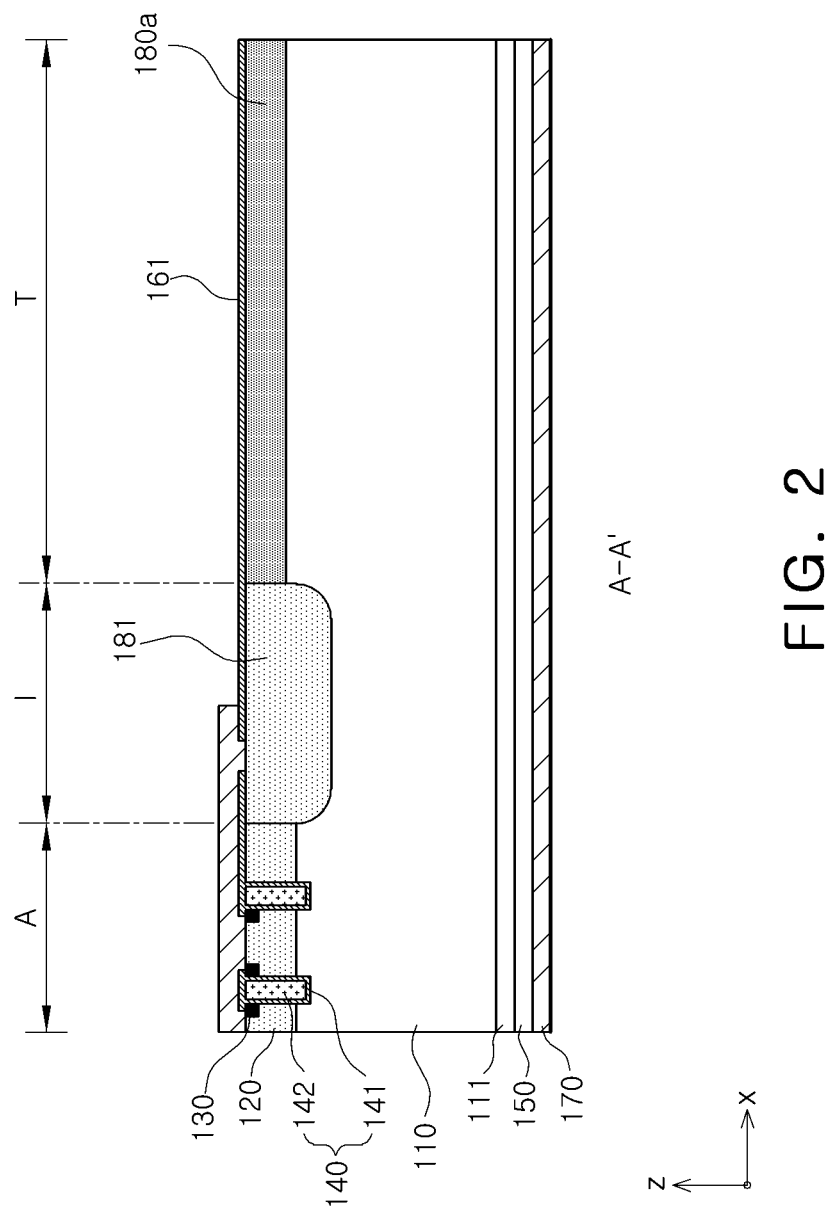
FIG. 2 schematically illustrates a cross-sectional view taken along a line A-A' of FIG. 1.
Figure 3:
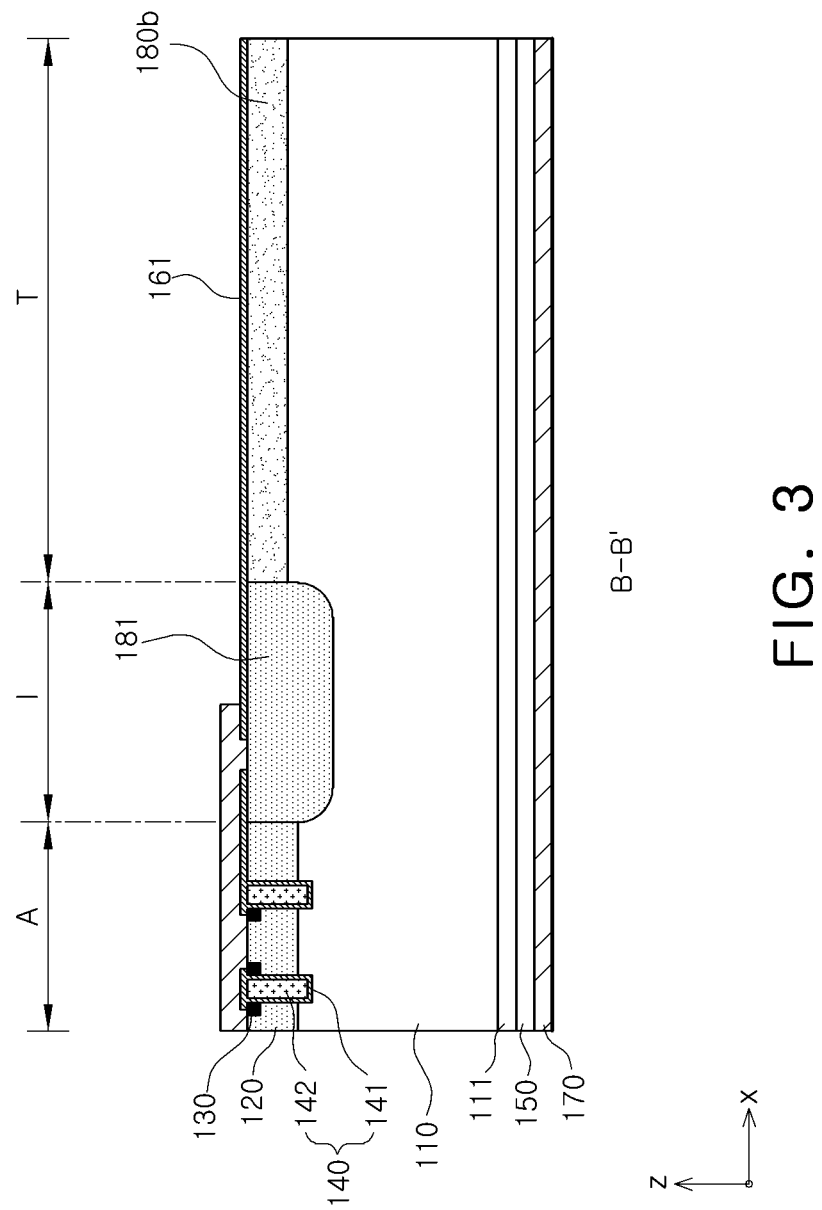
FIG. 3 schematically illustrates a cross-sectional view taken along a line B-B' of FIG. 1.

FIG. 1 schematically illustrates a perspective view of a power semiconductor device according to an exemplary embodiment of the present disclosure, and FIGS. 2 and 3 schematically illustrate cross-sectional views taken along a line A-A' and a line B-B', respectively, of FIG. 1.

FIG. 1 schematically illustrates a perspective view of a power semiconductor device 100 according to an exemplary embodiment of the present disclosure and FIG. 2 schematically illustrates a power semiconductor device 100 according to an exemplary embodiment of the present disclosure.

First, a structure of an active region A will be described.

The active region A may include a drift region 110, a body region 120, an emitter region 130, and a collector region 150.

The drift region 110 may be formed by injecting an n-type impurity at a low concentration.

Therefore, the drift region 110 may be relatively thick in order to maintain a blocking voltage of the device.

The drift region 110 may further include a buffer region 111 at a lower portion thereof.

The buffer region 111 may be formed by injecting the n-type impurity into a rear surface of the drift region 110.

In the case in which a depletion region of the device is expanded, the buffer region 111 serves to prevent the expansion to thereby maintain the blocking voltage of the device.

Therefore, when the buffer region 111 is formed, the drift region 110 may become thin, whereby the power semiconductor device may be miniaturized.

The body region 120 may be formed by injecting a p-type impurity onto the drift region 110.

Since the body region 120 has p-type conductive type, it may form a p-n junction with the drift region 110.

The n-type impurity may be injected into an inner side of an upper surface of the body region 120 at a high concentration to form an emitter region 130.

A trench gate 140 penetrating through the body region 120 from the emitter region 130 and reaching the drift region 110 may be formed.

That is, the trench gate 140 may be formed so as to extend from the emitter region 130 to a portion of the drift region 110 in a depth direction (z direction).

The trench gate 140 may be lengthily formed in one direction (y direction) and be arranged at a predetermined interval in a direction (x direction) perpendicular to the direction in which the trench gate 140 is lengthily formed.

The trench gate 140 may have a gate insulating layer 141 formed on portions contacting the drift region 110, the body region 120, and the emitter region 130.

The gate insulating layer 141 may be formed of silicon oxide ($SiO_2$), but is not limited thereto.

The trench gate 140 may be filled with a conductive material 142.

The conductive material 142 may be a poly-silicon (Poly-Si) or a metal, but is not limited thereto.

The conductive material 142 may be electrically connected to a gate electrode (not shown) to thereby control an operation of the power semiconductor device 100 according to an exemplary embodiment of the present disclosure.

In the case in which a positive voltage is applied to the conductive material 142, a channel C may be formed in the body region 120.

Specifically, in the case in which the positive voltage is applied to the conductive material 142, electrons present in the body region 120 are attracted toward the trench gate 140 and are gathered around the trench gate 140 to thereby form the channel C.

That is, the trench gate 140 attracts the electrons toward the depletion region, in which carriers are not present due to recombination of the electron and the hole by the p-n junction, to form the channel C, thereby allowing a current to be flown.

The collector region 150 may be formed by injecting the p-type impurity at a lower portion of the drift region 110 or of the buffer region 111.

In the case in which the power semiconductor device is the IGBT, the collector region 150 may provide the hole to the power semiconductor device.

In the case in which the power semiconductor device is a MOSFET, the collector region 150 may have an n-type conductive type.

An emitter metal layer 160 may be formed on an exposed upper surface of the emitter region 130 and the body region 120, and a collector metal layer 170 may be formed on a lower surface of the collector region 150.

In order to improve a blocking voltage, a deep body region 181 may be formed at a boundary between the active region A and a termination region T.

That is, the power semiconductor device 100 may further include an intermediate region I disposed at the boundary between the active region A and the termination region T, and a p-type deep body region 181 may further be formed on the intermediate region I.

The intermediate region I may serve to expand an electric field of the active region A to the termination region T.

The deep body region 181 may be formed deeper from a surface compared to the body region 120 and may contact the emitter metal layer 160 by partially opening an insulating layer on the surface.

In the case in which the deep body region 181 contacts the emitter metal layer 170, a path capable of discharging the hole present in the active region A at the time of a switching operation of the power semiconductor device may be formed.

Next, a structure of the termination region T will be described.

The termination region T may be provided with a resurf region 180.

The resurf region 180 may be formed on the drift region 110 of the termination region T.

The resurf region 180 may be formed so as to have a shape in which an n-type first semiconductor region 180a and a p-type second semiconductor region 180b alternate with each other.

The resurf region 180 may be lengthily formed from the active region A to the termination region T.

For example, the resurf region 180 may be lengthily formed on the termination region T from a boundary line between the active region A and the termination region T, or a boundary line between the intermediate region I and the termination region T, toward an outer direction of the power semiconductor device.

The resurf region 180 may be lengthily formed on the termination region T so as to be perpendicular to the boundary line between the active region A and the termination region T or the boundary line between the intermediate region I and the termination region T.

The resurf region 180 may be formed by injecting an n-type impurity and a p-type impurity into the first semiconductor region 180a and the second semiconductor region 180b, respectively.

The resurf region 180 may be formed so as to have a depth shallower than the depth at which the body region 120 of the active region A is formed from the surface.

In the case in which the power semiconductor device further includes the intermediate region I and the deep body region 181 formed on the intermediate region I, the resurf region 180 may have an impurity concentration lower than that of the deep body region 181.

That is, the first semiconductor region 180a and the second semiconductor region 180b may have the impurity concentration lower than that of the deep body region 181.

The resurf region 180 may have an insulating film 161 formed thereon to be insulated from the emitter metal layer 160.

The first semiconductor region 180a and the second semiconductor region 180b may be formed so as to alternate with each other.

That is, the first semiconductor region 180a and the second semiconductor region 180b may be formed so as to alternate with each other in a direction parallel to the boundary between the active region A and the termination region T.

For example, the first semiconductor region 180a and the second semiconductor region 180b may be formed so as to have a stripe shape.

The first semiconductor region 180a and the second semiconductor region 180b may have a stripe lengthily formed from the active region A to the termination region T.

Since the first semiconductor region 180a is the n-type semiconductor region and the second semiconductor region 180b is the p-type semiconductor region, a depletion region may be formed at a boundary at which the first semiconductor region 180a and the second semiconductor region 180b contact each other.

In the case in which the power semiconductor device is applied with an inverse voltage or is operated in a blocking mode, the depletion region may be gradually expanded from the boundary at which the first semiconductor region 180a and the second semiconductor region 180b contact each other.

An expanded direction of the electric field forming the depletion region in the blocking mode may be formed in a length direction of the resurf region 180 and a direction perpendicular to the length direction.

Unlike the related art, in the power semiconductor device according to an exemplary embodiment of the present disclosure, the depletion region is first expanded in the first semiconductor region 180a and the second semiconductor region 180b in the blocking mode, and after both the first semiconductor region 180a and the second semiconductor region 180b are depleted, the depletion region is expanded in the termination region direction.

Therefore, in comparison to the related art, when the same inverse voltage is applied, the electric field of the power semiconductor device according to an exemplary embodiment of the present disclosure may be expanded less to the termination region.

That is, the blocking voltage of the power semiconductor device according to an exemplary embodiment of the present disclosure may be improved, compared to the related art.

In addition, the power semiconductor device may be miniaturized by decreasing an area of the termination region under the same blocking voltage.

In order to improve the inverse voltage under which both the first semiconductor region 180a and the second semiconductor region 180b are depleted, the first semiconductor region 180a and the second semiconductor region 180b may be formed in a way that a product of a width of the first semiconductor region 180a and an impurity concentration of the first semiconductor region 180a and a product of a width of the second semiconductor region 180b and an impurity concentration of the second semiconductor region 180b are equal to each other.

In the case in which the first semiconductor region 180a and the second semiconductor region 180b are formed in a way that the product of the width of the first semiconductor region 180a and the impurity concentration of the first semiconductor region 180a and the product of the width of the second semiconductor region 180b and the impurity concentration of the second semiconductor region 180b are equal to each other, the first semiconductor region 180a and the second semiconductor region 180b may be simultaneously depleted.

According to the related art, the blocking voltage of the termination region is improved by forming a plurality of guard rings in the termination region by injecting the p-type impurity.

In the case of improving the blocking voltage of the termination region by using the guard ring as illustrated in the related art, since sufficient space is required in which the electric field may be expanded, there was a need to sufficiently increase the area of the termination region.

Although the termination region is directly associated with securing reliability of the power semiconductor device, the current flows in the active region, and an increase in the termination region within the power semiconductor device, which is limited in size, may indicate a decrease in the active region.

That is, when the termination region is increased to improve reliability of the device, a region in the power semiconductor device in which the current may flow is decreased, whereby performance of the power semiconductor device may be decreased.

However, in the case in which the resurf region is formed in the termination region as illustrated in the power semiconductor device according to an exemplary embodiment of the present disclosure, since the depletion region supports the blocking voltage while being expanded in the resurf region in the blocking mode, the area of the termination region may be decreased by at least 40% or more, compared to the related art.

That is, the power semiconductor device according to an exemplary embodiment of the present disclosure may form the area of the termination region to be small as possible, such that the active area in which the current may flow may be maximized in the power semiconductor device, thereby improving performance of the power semiconductor device.

On the contrary, in the case in which the area of the termination region is not decreased, the power semiconductor device according to an exemplary embodiment of the present disclosure may be used for a power semiconductor device having a high blocking voltage.

In general, the electric field becomes weaker as it becomes farther from the active region.

Therefore, the impurity concentration of the resurf region 180 may gradually become lower as the resurf region 180 becomes farther from the active region A.

That is, when forming the first semiconductor region 180a and the second semiconductor region 180b, they may be formed so as to have lower impurity concentrations as they become farther from the active region A.

The impurity concentration of the resurf region 180 may be decreased linearly or stepwise, but is not limited thereto.

Figure 4:
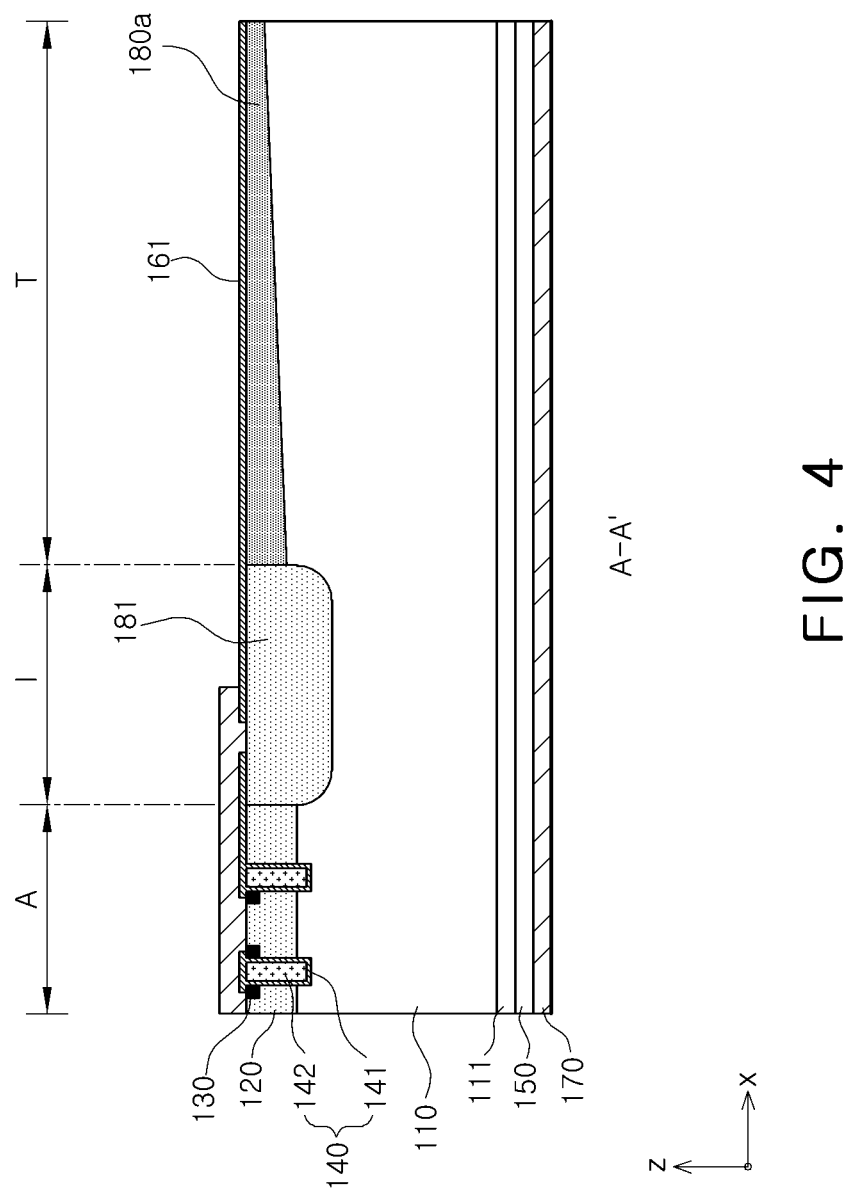
FIG. 4 schematically illustrates a cross-sectional view of a power semiconductor device according to another exemplary embodiment of the present disclosure.

FIG. 4 schematically illustrates a cross-sectional view of a power semiconductor device according to another exemplary embodiment of the present disclosure.

Although FIG. 4 illustrates a cross-section representing the first semiconductor region 180a, matters to be described below may be applied to the second semiconductor region 180b.

As described above, the electric field becomes weaker as it becomes farther from the active region.

In addition, as illustrated in FIG. 4, a depth from an upper surface of the resurf region 180 may gradually become shallower as the resurf region 180 becomes farther from the active region A.

That is, the depth in which the resurf region 180 is formed may become shallower corresponding to the degree at which the electric field becomes weaker, whereby the resurf region 180 may be adjusted to uniformly expand the electric field.

In the case in which the electric field is changed while having a large curvature, the electric field is concentrated on the changed portion, such that the blocking voltage may be decreased.

However, the power semiconductor device according to an exemplary embodiment of the present disclosure may form the depth from the upper surface of the resurf region 180 to be shallow according to the decrease in the electric field in the termination region T, thereby preventing the electric field concentration and improving the blocking voltage.

That is, since the resurf region 180 is thinner as it becomes farther from the active region A, the power semiconductor device may allow the electric field to be uniformly expanded, thereby improving the blocking voltage.

In order to adjust the depth in which the resurf region 180 is formed, when forming the first semiconductor region 180a and the second semiconductor region 180b, energy of the injected impurity may be adjusted.

Alternatively, the depth may be adjusted by injecting different amounts of impurity and then differently forming a dispersed depth by performing a heat process when forming the first semiconductor region 180a and the second semiconductor region 180b.

The adjustment of the depth in which the resurf region 180 is formed may allow the depth to be linearly decreased and may adjust the depth formed stepwise, if necessary. However, the present disclosure is not limited thereto.

As set forth above, according to exemplary embodiments of the present disclosure, since the power semiconductor device includes the n-type first semiconductor region formed on the termination region and lengthily formed so as to be perpendicular to the active region and the p-type second semiconductor region formed on the termination region, lengthily formed from the active region, and formed so as to alternate with the first semiconductor region, when the inverse voltage is applied to the power semiconductor device, the depletion layer is expanded in the termination region, whereby the blocking voltage may be increased.

Therefore, by decreasing the length of the depletion layer expanded to the termination region in the same blocking voltage, the area occupied by the termination region in the power semiconductor device may be decreased.

While exemplary embodiments have been shown and described above, it will be apparent to those skilled in the art that modifications and variations could be made without departing from the spirit and scope of the present disclosure as defined by the appended claims.

What is claimed is:

1. A power semiconductor device, comprising:
an active region in which a current flows through a channel formed when the device being turned on;
a termination region disposed around the active region and extending along a first direction away from the active region;
a first semiconductor region of a first conductive type disposed in the termination region and extending along the first direction; and
a second semiconductor region of a second conductive type formed on the termination region and extending along the first direction, the first semiconductor region and the second semiconductor region being disposed alternately along a second direction crossing the first direction, wherein:
a product of an impurity concentration of the first semiconductor region and a width of the first semiconductor region is equal to a product of an impurity concentration of the second semiconductor region and a width of the second semiconductor region, and
an impurity concentration of the first semiconductor region and an impurity concentration of the second semiconductor region gradually become lower as the first semiconductor region and the second semiconductor region become farther from the active region.

2. The power semiconductor device of claim 1, wherein a thickness of the first semiconductor region and a thickness of the second semiconductor region gradually become thinner as the first semiconductor region and the second semiconductor region become farther from the active region.

3. The power semiconductor device of claim 1, wherein a depletion region is expanded at a boundary between the first semiconductor region and the second semiconductor region in a blocking mode according to a voltage.

4. The power semiconductor device of claim 1, further comprising an intermediate region formed between the active region and the termination region and serving to expand an electric field of the active region to the termination region.

5. The power semiconductor device of claim 4, further comprising a deep body region of a second conductive type formed on the intermediate region.

6. The power semiconductor device of claim 5, wherein the first semiconductor region and the second semiconductor region have the impurity concentration lower than that of the deep body region.

7. A power semiconductor device, comprising:
an active region in which a current flows through a channel formed when the device being turned on;
a termination region formed around the active region and extending along a first direction away from the active region; and
a resurf region formed on the termination region and extending along the first direction,
wherein the resurf region is formed by alternating, along a second direction crossing the first direction, a first semiconductor region of a first conductive type and a second semiconductor region of a second conductive type, wherein:
a product of an impurity concentration of the first semiconductor region and a width of the first semiconductor region is equal to a product of an impurity concentration of the second semiconductor region and a width of the second semiconductor region, and
an impurity concentration of the resurf region gradually becomes lower as the resurf region becomes farther from the active region.

8. The power semiconductor device of claim 7, wherein a thickness of the resurf region gradually becomes thinner as the resurf region becomes farther from the active region.

9. The power semiconductor device of claim 7, further comprising an intermediate region formed between the active region and the termination region and serving to expand an electric field of the active region to the termination region.

10. The power semiconductor device of claim 9, further comprising a deep body region of a second conductive type formed on the intermediate region.

11. The power semiconductor device of claim 10, wherein the resurf region has the impurity concentration lower than that of the deep body region.

* * * * *